United States Patent
Leobandung

(10) Patent No.: US 12,374,628 B2
(45) Date of Patent: Jul. 29, 2025

(54) PROCESSOR DIE ALIGNMENT GUIDES

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 229 days.

(21) Appl. No.: 17/532,423

(22) Filed: Nov. 22, 2021

(65) Prior Publication Data
US 2023/0163080 A1    May 25, 2023

(51) Int. Cl.
| | | |
|---|---|---|
| H01L 23/544 | (2006.01) | |
| H01L 21/306 | (2006.01) | |
| H01L 21/308 | (2006.01) | |
| H01L 21/56 | (2006.01) | |
| H01L 23/00 | (2006.01) | |
| H01L 25/065 | (2023.01) | |
| H01L 23/31 | (2006.01) | |

(52) U.S. Cl.
CPC ...... *H01L 23/544* (2013.01); *H01L 21/30604* (2013.01); *H01L 21/308* (2013.01); *H01L 21/561* (2013.01); *H01L 24/18* (2013.01); *H01L 25/0655* (2013.01); *H01L 23/3128* (2013.01); *H01L 2223/54426* (2013.01); *H01L 2223/54453* (2013.01); *H01L 2223/54486* (2013.01)

(58) Field of Classification Search
CPC ............. H01L 21/561; H01L 23/544; H01L 2223/54426; H01L 2224/81136; H01L 2224/81138
See application file for complete search history.

(56) References Cited

U.S. PATENT DOCUMENTS

| | | | | |
|---|---|---|---|---|
| 5,172,303 | A * | 12/1992 | Bernardoni | H01L 25/105 174/521 |
| 6,160,936 | A * | 12/2000 | You | G02B 6/30 385/52 |
| 6,429,045 | B1 * | 8/2002 | Furukawa | H01L 24/81 257/E29.022 |
| 7,745,301 | B2 * | 6/2010 | Vora | H01L 23/544 257/E23.179 |
| 7,893,531 | B2 * | 2/2011 | Mitchell | H01L 24/02 257/E23.18 |
| 8,218,334 | B2 * | 7/2012 | Chow | H01L 23/13 361/803 |
| 10,692,795 | B2 * | 6/2020 | Nah | B82Y 10/00 |
| 2011/0042799 | A1 * | 2/2011 | Kang | H01L 23/3128 257/692 |
| 2015/0214127 | A1 * | 7/2015 | Gu | H01L 24/83 438/118 |
| 2017/0062394 | A1 * | 3/2017 | Lin | H01L 23/36 |

* cited by examiner

*Primary Examiner* — Yara B Green
*Assistant Examiner* — Victor V Barzykin
(74) *Attorney, Agent, or Firm* — Kimberly Zillig

(57) ABSTRACT

An aggregate die comprises a substrate, a first sub die, and a second sub die. The substrate comprises a surface with a first set of substrate alignment guides and a second set of substrate alignment guides. The first sub die comprises a first set of sub die alignment guides that interface with the substrate alignment guides in the first set of substrate alignment guides. The second sub die comprises a second set of sub die alignment guides that interface with substrate alignment guides in the second set of substrate alignment guides.

12 Claims, 8 Drawing Sheets

PROCESSOR DIE ALIGNMENT GUIDES

BACKGROUND

The present invention relates to processor die formation, and more specifically, to forming aggregate processor dies.

Processor dies are typically formed on a silicon substrate material, such as a silicon wafer. In typical processor formation, many identical dies may be formed at the same time on a single physical wafer. Testing those many dies for defects can reveal dies that meet performance standards for being inserted into a computer system.

In some industries, multiple processor dies are combined before being inserted into a computer system. These dies are sometimes combined onto a substrate, so the system into which they are inserted may register them as a single processor die.

SUMMARY

Some embodiments of the present disclosure can be illustrated as an aggregate die that comprises a substrate with a first surface. The first surface comprises a first set of substrate alignment guides and a second set of substrate alignment guides. The aggregate die also comprises a first sub die attached to the first surface. The first sub die comprises a first set of sub die alignment guides that interface with the substrate alignment guides in the first set of substrate alignment guides. The aggregate die also comprises a second sub die attached to the first surface, wherein the second sub die comprises a second set of sub die alignment guides that interface with substrate alignment guides in the second set of substrate alignment guides.

Some embodiments of the present disclosure can also be illustrated as a method. The method comprises attaching a first set of hardmasks on a first surface of a wafer. The method also comprises forming, through an etching process, a first set of alignment guides on the first surface of the wafer. The method also comprises removing the set of hardmasks from the wafer.

Some embodiments of the present disclosure can also be illustrated as a sub die. The sub die comprises a first surface with a set of pointed sub die alignment guides. The sub die also comprises a second surface with a set of sub die contacts. The second surface is opposite the first surface.

DETAILED DESCRIPTION

Figure 1:
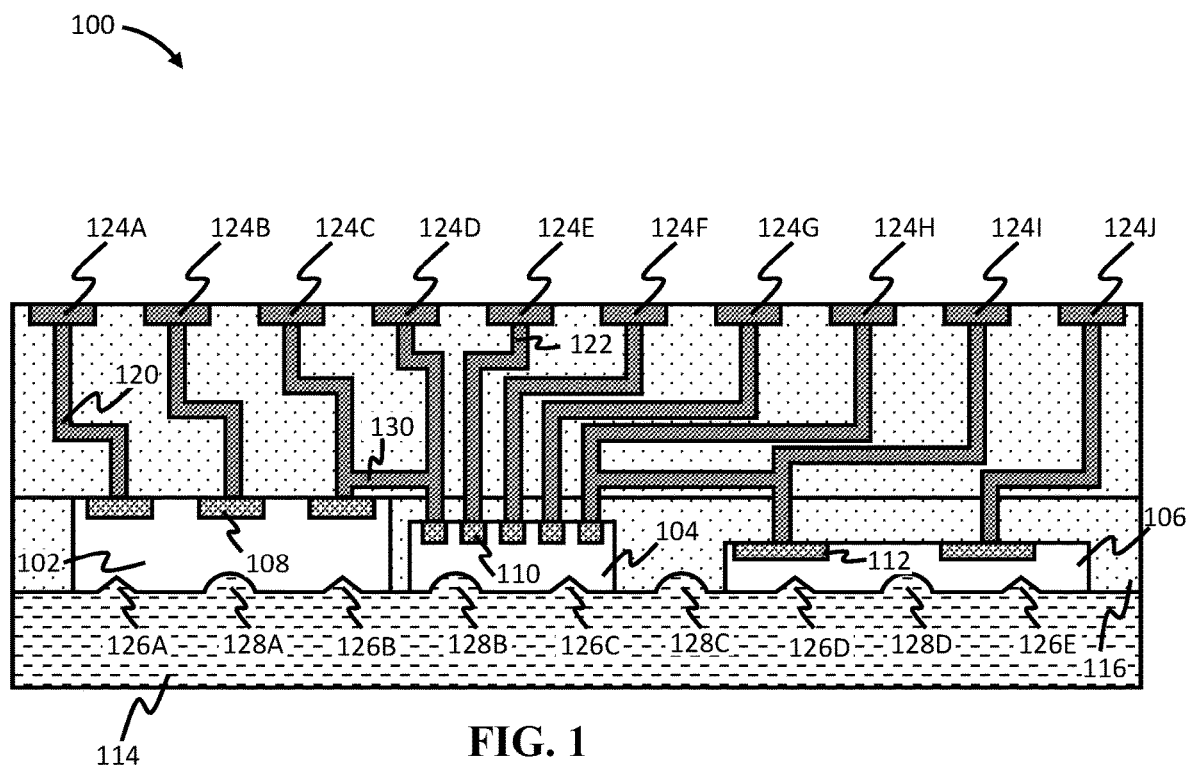
FIG. 1 depicts an aggregate processor die according to embodiments of the present disclosure.

Processor dies for complex, powerful microprocessors are oftentimes significantly larger than processor dies for simple microprocessors. These larger dies understandably take up more surface area on the wafers on which they are formed. Thus, a 300 mm diameter silicon wafer on which large, complex processor dies are formed may contain 100 dies, whereas a 0.5 square-meter silicon wafer on which small, simple processor dies are formed may contain 1,000 dies.

Typical die formation processes suffer from a silicon defect rate that can be expressed as the average number of defects per unit of surface area (e.g., 1 defect per square centimeter). For each of these defects, there is a risk that the die containing the defect may be rendered unsuitable for the die's intended purpose. For example, a defect may cause one or more of a die's processing cores to be non-functional, one or more sections of a die's cache to be unusable, the die to be unstable at a target frequency for the microprocessor, or cause the die to be completely nonfunctional.

Because larger dies occupy more surface area on the wafer on which they are formed, the yields for larger dies tend to be lower than the yields for smaller dies given the same defect rate. For example, a particular formation process may result, on average, in 10 defects per 0.5 square-meter wafer. If each wafer contains 100 dies, then those 10 defects on each wafer would result in only 90 dies per wafer being functional (i.e., a yield of 90%). However, if each wafer contains 1,000 dies, those 10 defects may result in 990 dies per wafer being functional (i.e., a yield of 99%).

Thus, processor designers and manufacturers expend effort to limit the size of dies. Nonetheless, growing performance requirements sometimes result in processor dies that are significantly large, despite those efforts. This can significantly increase the cost of large complex dies, which may already be expensive due to the research and design required to create them.

One method to mitigate the low yields of large dies involves separating the functions of a large, complex processor (e.g., simple arithmetic functions, AI calculations, wireless communication functions) into smaller sub dies (e.g., a sub die for simple arithmetic functions, a sub die for AI calculations, and a sub die for wireless communication functions). These smaller sub dies can then be combined on a substrate (e.g., a silicon wafer) to form a larger aggregate die. Because each of the sub dies in the aggregate die may be significantly smaller than a traditional die with similar functions and performance of the aggregate die would be, the yields of each sub die may be significantly higher than the yield of that standard die would be.

However, while the yields of the sub dies may be significantly higher than the yields of the standard die, the yield of the aggregate die may be reduced by assembly imprecision. Specifically, imprecise placement of the sub dies on the aggregate die may cause connection problems between the sub dies and the system into which the aggregate die is inserted. This is because, when connecting the aggregate die to another system, each contact point on each sub die in the aggregate die may need to connect with a corresponding contact point on a system connector (e.g., a motherboard CPU socket). This may require those contact points to be lined up properly in order to interface and form that connection. Thus, if a sub die is added to an aggregate die in a slightly incorrect precision or at a slightly incorrect angle, the sub die may not connect to the system connector properly. This would be analogous to a connector in a CPU socket on a motherboard being missing, and could potentially cause the aggregate die to fail.

Similarly, multiple sub dies within an aggregate die often need to communicate with each other. This communication is typically performed through wiring between sub dies within the aggregate die layers. This wiring is typically very fine in order to avoid a need to increase the size of the aggregate die to make room for the wiring. Unfortunately, this also means that the connections between the sub dies and this wiring also must often be very accurate. A sub die that is placed slightly out of position or in a slightly unintended orientation may result in the sub die not contacting that fine wiring, causing in a short or open connection between the sub dies.

Unfortunately, typical methods of adding sub dies to an aggregate die substrate (e.g., a wafer section) often introduce such a high level of imprecision that, without being addressed, the increased yields of the sub dies is overcome by the decreased aggregate-die yields due to improperly placed sub dies. One method of addressing the high level of imprecision involves forming the contact points on the system connector (or a connector within the aggregate die) to be much larger, so a slight shift in the position or orientation of a sub die would still result in the connectors of that sub die to make contact with those larger contact points.

However, larger contact points significantly increasing the wire pitch of the system connector, aggregate die, and even the sub dies in the aggregate die. Thus, this method of addressing imprecise sub-die placement can greatly increase the overall size of an aggregate die and even the system into which it is installed. Not only do these larger components typically cost more to manufacture than smaller components, but it can also be more expensive to design a system that can efficiently incorporate them. Further, increasing the wire pitch of a sub die can require increasing the overall die size of that sub die. As discussed above, increasing the overall size of a die, whether it be a traditional die or sub die, can decrease the amount of dies per wafer and increase the amount of defects per quantity of dies. Thus, this method of mitigating the effects of imprecise sub die placement can decrease the yield of the sub dies themselves, which counteracts the original purpose of designing an aggregate die.

To address the problems explained above, some embodiments of the present disclosure present alignment guides on sub dies and aggregate die substrates to increase the precision of sub die placement on those aggregate die substrates. For example, in some embodiments a series of small bumps may be formed on the bottom of a sub die. These bumps may correspond to a series of holes formed on the top of a silicon wafer to which the sub die is to be attached. When the sub die is placed on the silicon wafer, the bumps and holes may encourage the sub die to settle in a location and orientation in which the bumps are able to enter the holes. This may encourage the sub die to be attached to the aggregate die in a position and at an orientation that enables the sub die to make contact with a system connector. This added level of precision may prevent the sub die from malfunctioning, and can enable the wire pitch of the sub die, aggregate die, and system connector to be significantly finer.

FIG. 1 illustrates an aggregate processor die 100 according to embodiments of the present disclosure. Aggregate processor die 100 contains three sub dies 102, 104, and 106. Each of sub dies 102, 104, and 106 may have varying properties, such as different functions or compositions, that may be combined within aggregate die 100. For example, sub die 102 may be a silicon die that specializes in arithmetic functions, sub die 104 may be a silicon die that specializes in artificial-intelligence predictions, and sub die 106 may be a gallium arsenide die that specializes in radio-frequency communications.

As illustrated, sub dies 102, 104, and 106 also exhibit contacts of different sizes and pitches. For example, sub die 102 exhibits three contacts (e.g., contact 108) that are of moderate size and moderate distance apart. Sub die 104 exhibits five contacts (e.g., contact 110) that are of small size and small distance apart. Finally, sub die 106 exhibits two contacts (e.g., contact 112) that are of large size and large distance apart.

Sub dies 102-106 are inserted onto die substrate 114. The material properties of substrate 114 could vary, but may be a silicon-based substrate such as a silicon wafer on in which no transistors have been formed. Sub dies 102-106 are then embedded within dielectric 116, which is depicted here with a height equal to that of the tallest of sub dies 102-106 (i.e., sub die 102). Dielectric 118 is formed on dielectric 116 and sub die 102. Together, dielectrics 116 and 118 contain the routing wires (e.g., wires 120 and 122) that connect the sub-die contacts to the aggregate-die contacts 124A-124J and the routing wires (e.g., wire 130) that connect the sub dies to each other. While dielectrics 116 and 118 are depicted as separate layers, they may actually be composed of the same material or even be a single continuous layer of dielectric.

As illustrated, the routing wires in dielectrics 116 and 118 connect the various sub-die contacts to the standard pitch of aggregate-die contacts 124A-124J and to other sub dies. Aggregate-die contacts 124A-124J may then be attached to a system connector, such as a motherboard. Thus, through the wiring in dielectrics 116 and 119, sub dies 102, 104, and 106 are able to communicate with each other and with the system, acting as a single die. In some embodiments, for example, aggregate die 100 may be mounted on a processor package substrate with a ball-grid array that has a corresponding solder ball for each of aggregate-die contacts 124A-124J.

However, if any of sub dies 102, 104, or 106 were shifted, as illustrated, to the right or left, the connections between the shifted sub die and the corresponding wiring between the sub dies or the aggregate-die contacts may not be made. For example, if sub die 104 were placed to the slightly to the right, sub-die contact 110 may not make contact with wire 122, due to the small size of both sub-die contact 110 and wire 122, which may cause sub die 104 to be non functional. Further, even if sub-die contact 110 did still make contact with wire 122, sub die 104 may not make contact with wire 130, which may cause both sub dies 104 and 108 to be non functional.

For this reason, die substrate 114 has been formed with substrate alignment guides (specifically, pointed alignment guides 126A-126E and rounded alignment guides 128A-128D). Further, each of sub dies 102-106 have been formed with sub-die alignment guides (not visible in FIG. 1) to correspond with pointed alignment guides 126A-126E and rounded alignment guides 128A, 128B, and 128D. These corresponding alignment guides may encourage the seating of sub dies 102-106 in precisely the desired location and orientation necessary to create a reliable connection between sub dies 102-106 and aggregate die contacts 124A-124J.

For example, sub die 102 is seated on substrate 114 with the help of pointed alignment guide 126A, rounded alignment guide 128A, and pointed alignment guide 126B. As such, sub die 102 would have been formed with pointed indents at a location to correspond to pointed alignment guides 126A and 126B and a rounded indent at a location to correspond to rounded alignment guide 128A. If sub die 102 were placed upon substrate 114 (for example, by a robotic arm) slightly to the left, it would not be seated properly. In that instance, the interactions between alignment guides 126A, 128A, and 126B and the corresponding sub-die alignment guides on sub die 102 may automatically cause sub die 102 to shift slightly to the right such that the alignment guides interfaced properly. This could cause sub die 102 to shift into the correct position such that a proper connection with aggregate die contacts 124A-124C would be made, even though sub die 102 may have been placed upon substrate 114 in a position at which those connections would not have been made.

On the other hand, if sub die 102 were placed upon substrate 114 far enough to the right or left that sub die 102 does not automatically shift into proper position, various actions could be taken to remedy the situation. For example, in some embodiments a "shifted sub die" alarm could be triggered, causing the robotic arm to move sub die 102 around the intended placement site until proper seating occurred. Alternatively, such an alarm may notify a manufacturing engineer that human intervention is necessary. In some embodiments, a robotic arm that is placing sub die 102 may automatically attempt to move sub die 102 to the left, right, and into and out of the paper to encourage proper seating.

As illustrated, pointed alignment guides 126A-126E and rounded 128A-128D are of different form factors. This may be beneficial to prevent sub die 102 from being shifted to the wrong set of substrate alignment guides. For example, if sub die 102 were placed before sub die 104, it is unlikely that sub die 102 would be shifted to the right to interface with rounded alignment guide 128B, because the sub-die alignment guide formed on sub die 102 to interface with pointed alignment guide 126B would not interface well with rounded alignment guide 128B.

Pointed alignment guides 126A-126E and rounded alignment guides 128A-128D are illustrated as having a constant pitch (i.e., the distance between the alignment guides) and size, but they could be formed at an inconsistent pitch and size to further encourage proper seating. For example, rounded alignment guide 128B and pointed alignment guide 126C could be relatively small and relatively close together, whereas pointed alignment guides 126D and 126E and rounded alignment guides 128D could be relatively large and far apart, preventing sub die 104 from interfacing with any alignment guide corresponding to sub die 106. Extending this further, sets of alignment guides may form patterns to encourage proper seating. For example, the set of sub die alignment guides on sub die 102 may form a "plus" shape when viewed from below. In this embodiment, the set of substrate alignment guides on substrate 114 that are designed to interface with sub die 102 may form a corresponding pattern (e.g., a plus shape). Similarly, the set of alignment guides on sub die 104 may form an upper-case "L" shape, and the set of alignment dies on sub die 106 may form a star shape or dot-matrix pattern.

On the other hand, in some embodiments, all substrate alignment guides formed on substrate 114 may be of the same size, shape, and pitch. While this may be slightly less likely to avoid improper placement of sub dies 102, 104, and 106, the ability to form all substrate alignment guides at the same time and with the same process may out weigh any resulting lack of precision. Further, if all substrate alignment guides were of the same size, shape, and pitch, the corresponding sub-die alignment guides may also be formed at the same time and with the same process, which may lead to further efficiencies and cost decreases.

Figure 2A:
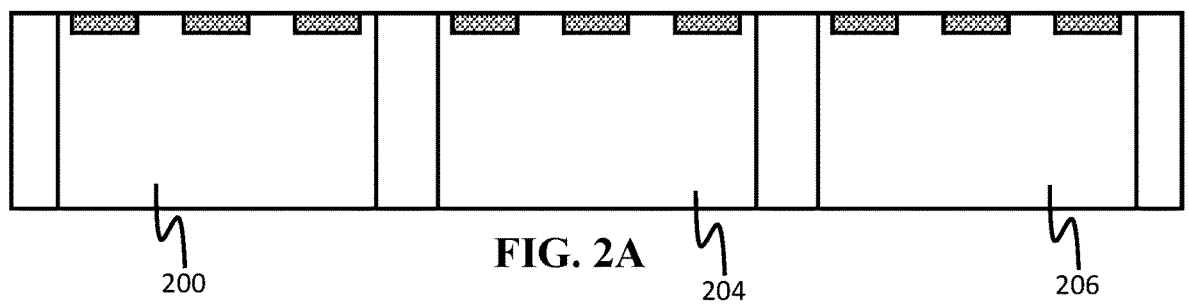
FIG. 2A depicts a first stage of forming a processor sub die with alignment guides, according to embodiments of the present disclosure.
Figure 2B:
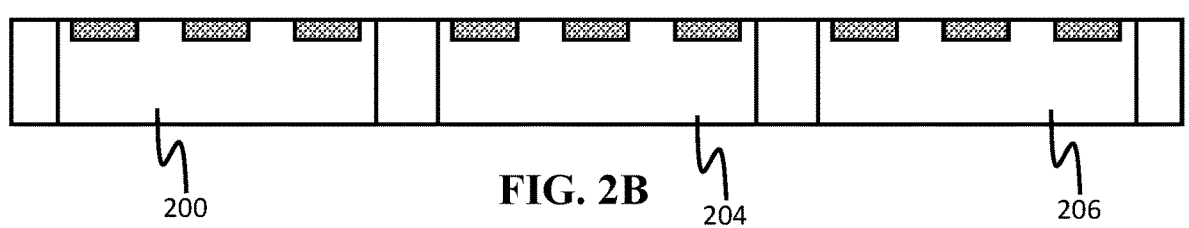
FIG. 2B depicts a second stage of forming the processor sub die with alignment guides, according to embodiments of the present disclosure.

FIGS. 2A-2I depict a process of forming a sub die 200 with sub-die alignment guides and seating that sub die upon a substrate with corresponding alignment guides, according to embodiments of the present disclosure. FIG. 2A depicts a first stage of forming sub die 200. In FIG. 2A, sub die 200 is depicted as part of wafer 202, which also includes dies 204 and 206. Wafer 202 may be, for example, a silicon wafer, in which case sub die 200 and dies 204 and 206 may be silicon dies of identical design. In FIG. 2B, wafer 202 has been thinned to a target height by removing excess silicon that does not contribute to transistors or wiring. The underside of wafer 202 may be polished as well.

In typical die formation, sub die 200 may be separated from wafer 202 at this point. However, in some embodiments of the present disclosure, sub die 200 may remain attached to wafer 202 until alignment guides have been formed on sub die 200. In some such embodiments, alignment guides may be formed on all dies of wafer 202 (including defective dies) at the same time using the same process. This may cause the alignment guides to be more precisely placed.

FIGS. 2C-2F illustrate the formation of alignment guides on sub die 200. In FIGS. 2C-2F, sub die 200 has been shown without dies 204 and 206 for the sake of understanding. However, as discussed above, sub die 200 may still be connected to wafer 202 at this during the formation of alignment guides. Further, the process of forming alignment guides on sub die 200 in FIGS. 2C-2F may be performed on each die in wafer 202.

Figure 2C:
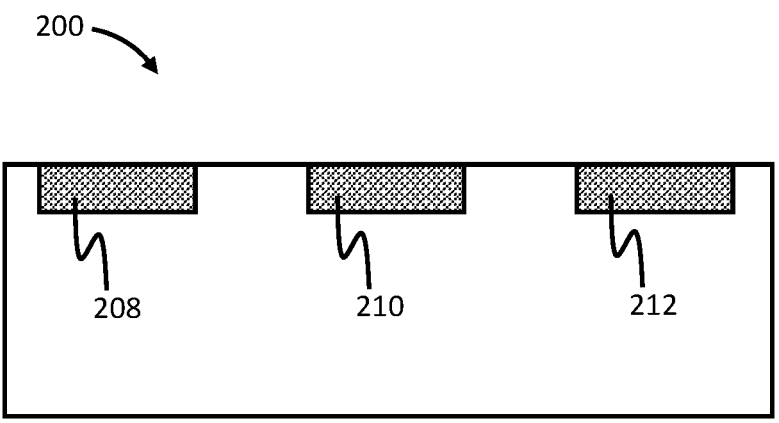
FIG. 2C depicts a third stage of forming the processor sub die with alignment guides, according to embodiments of the present disclosure.
Figure 2D:
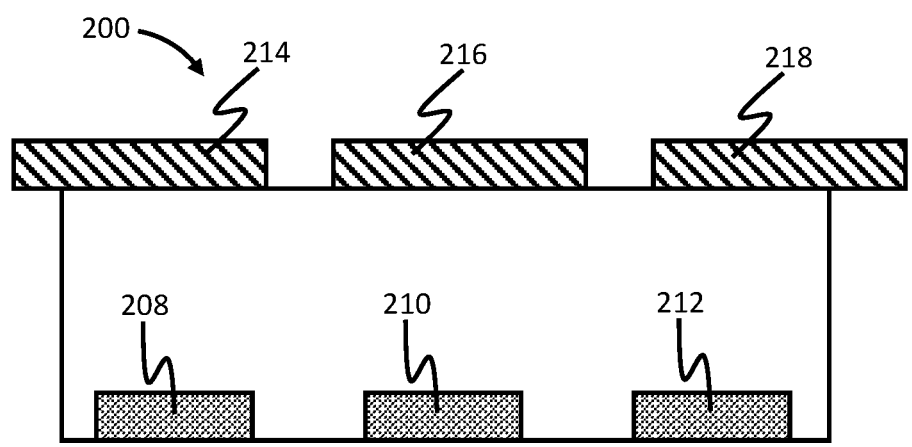
FIG. 2D depicts a fourth stage of forming the processor sub die with alignment guides, according to embodiments of the present disclosure.

In FIG. 2C, sub die 200 is depicted with contacts 208, 210, and 212 positioned towards the top of FIG. 2C. However, in FIG. 2D, sub die 200 has been flipped, and contacts 208-210 are towards the bottom of FIG. 2D. Further, hardmasks 214, 216, and 218 have been formed on the opposite side of sub die 200. Hardmasks 214-218 may be used to pattern sub-die alignment guides in subsequent etching processes, such as a chemical etching process. Thus, the properties of hardmasks 214-218 may depend on the etching process used and the properties of the alignment guides desired. In some embodiments, antisotropic KOH (potassium hydroxide) etching may be used to form alignment guides, in which case hardmasks 214-218 may take the form of silicon carbide resists. Further, the desired size and positions of alignment guides may impact the properties of hardmasks 214-218. In some embodiments, for example, hardmasks 214-218 may be between 5 and 10 microns wide, causing alignment guides to be formed on sub die 200 every 5 to 10 microns.

Figure 2E:
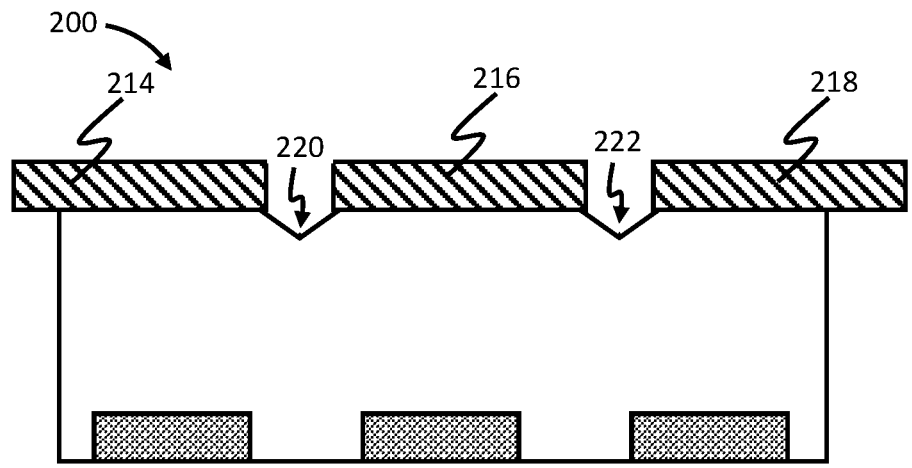
FIG. 2E depicts a fifth stage of forming the processor sub die with alignment guides, according to embodiments of the present disclosure.

FIG. 2E illustrates sub die 200 after an etching process, which has resulted in etching trenches 220 and 222 being formed between hardmasks 214-218. Trenches 220 and 222 may be utilized, and thus may also be referred to herein, as sub-die alignment guides. The properties of trenches 220 and 222 may vary based on the size and positions of hardmasks 214-218 and etching process used.

Figure 2F:
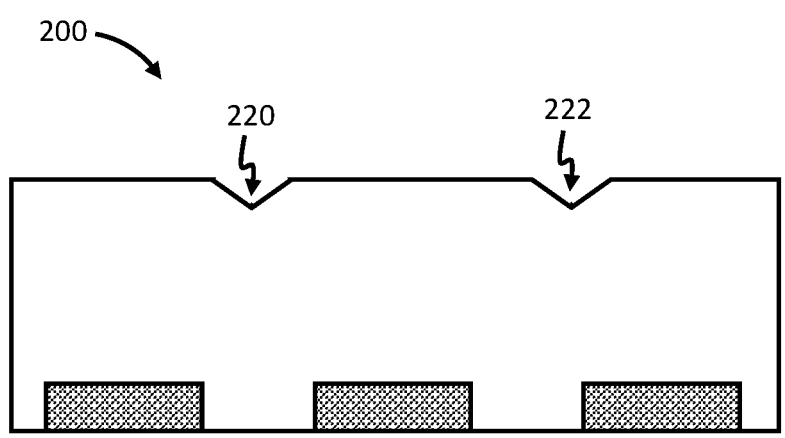
FIG. 2F depicts a sixth stage of forming the processor sub die with alignment guides, according to embodiments of the present disclosure.

FIG. 2F illustrates sub die 200 after hardmasks 214-218 have been removed. As such, FIG. 2F more clearly illustrates the structures of sub-die alignment guides 220 and 222. In some embodiments, sub die 200 could be separated from wafer 202 at this stage.

Figure 2G:
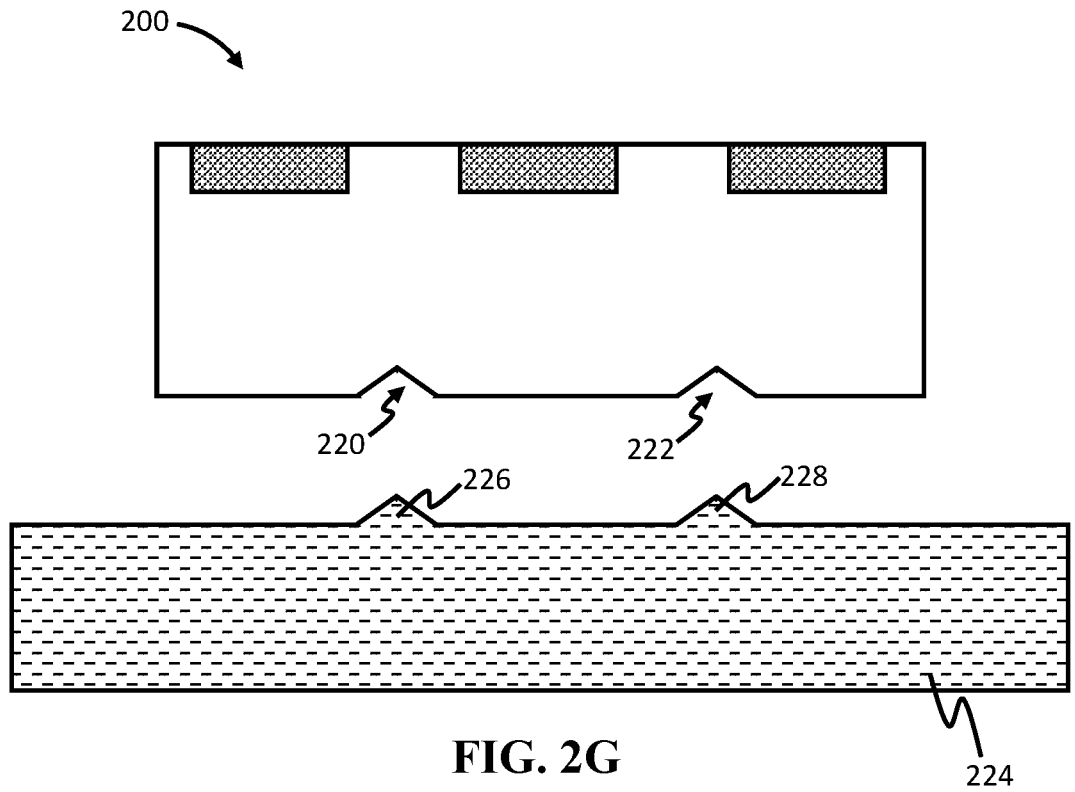
FIG. 2G depicts a first stage of attaching the processor sub die to an aggregate die substrate, according to embodiments of the present disclosure.
Figure 2H:
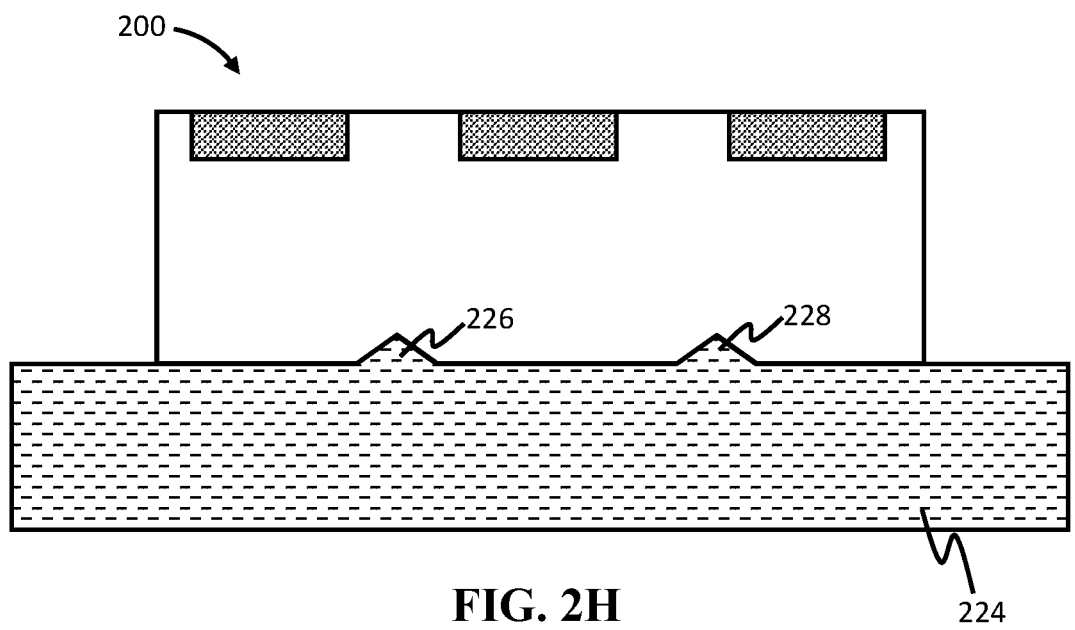
FIG. 2H depicts a second stage of attaching the processor sub die to the aggregate die substrate, according to embodiments of the present disclosure.

FIGS. 2G and 2H illustrate attaching sub die 200 to an aggregate die substrate 224. As illustrated in FIG. 2G, aggregate die substrate 224 has been formed with substrate alignment guides 226 and 228 patterned thereon. Substrate alignment guides 226 and 228 are designed to interface with sub-die alignment guides 220 and 222. As illustrated, substrate alignment guides 226 and 228 are both convex and sub die alignment guides 220 and 222 are both concave. However, in some embodiments sub die alignment guides 220 and 222 may be convex and substrate alignment guides 226 and 228 may be concave. Or, in some embodiments, each set of alignment guides may be a mixture of convex and concave. For example, in some embodiments sub die alignment guide 220 and substrate alignment guide 228 may be convex and sub die alignment guide 222 and substrate alignment guide 226 may be concave. In some embodiments, substrate alignment guides 226 and 228 may be patterned to be slightly smaller than trenches 220 and 222, which may make a successful seating of sub die 200 onto aggregate die substrate 224 more likely.

FIG. 2H illustrates sub die 200 after being placed on aggregate die substrate 224. As illustrated, substrate alignment guides 226 and 228 interface with sub-die alignment guides 220 and 222 (not visible in FIG. 2H) such that precise placement of sub die 200 is encouraged. Of note, while sub die 200 is the only sub die depicted placed on aggregate die substrate 224, this is solely for the purpose of clarity. In typical embodiments multiple sub dies are likely to be added to aggregate die substrate 224.

As noted, FIG. 2A through 2H illustrates a process of forming alignment guides on a sub die and placing that sub die onto a substrate, such as a silicon wafer, that features corresponding alignment guides. In some use cases, that substrate and the alignment guides thereon may be made by a similar process as the sub die and may even be made by the same entity. However, in other use cases the processes used to form the substrate or alignment guides thereon may differ from the processes used to form the substrate. Further, in some use cases the substrate and alignment guides thereon may be formed by a different entity than the entity performing some or all of the steps of FIGS. 2A-2H. For example, in some use cases a first entity may manufacture a gallium-arsenide-, silicon-carbide-, or gallium-nitride-based sub die with alignment guides, receive a silicon wafer with corresponding alignment guides from a second entity, and attach the sub die to the wafer.

In other use cases, however, a first entity may form an aggregate-die substrate and receive one or more sub dies from other entities and attach those sub dies to the substrate. In those use cases, the sub dies received may already have alignment guides patterned thereon, or the first entity may pattern the alignment guides on the sub dies after receiving them.

For example, a microprocessor assembler may fabricate a substrate wafer with alignment guides and receive an arithmetic sub die from a first third party, a cache-memory sub die from a second third party, and an artificial-intelligence sub die from a third third party. In some instances, these three sub dies may already have alignment guides patterned thereon when received by the microprocessor assembler. This may allow for more precisely patterned alignment guides, for example, if the sub dies are delivered after their respective wafers are cut up and defective sub dies are discarded (i.e., if individual sub dies are delivered, rather than one or more complete wafers). However, if the sub dies are delivered to the assembler before their respective wafers are cut, the microprocessor assembler may pattern the alignment guides on the wafer before cutting the wafers into individual sub dies.

FIGS. 3A-3E depict a process of forming an aggregate die substrate 300 with alignment guides thereon and attaching a sub die with corresponding alignment guides to that substrate. The process steps illustrated in FIGS. 3A-3E may be performed, for example, by a manufacturer of microprocessor aggregate-die packages that receives one or more sub dies from a third-party fabricator.

Figure 3A:
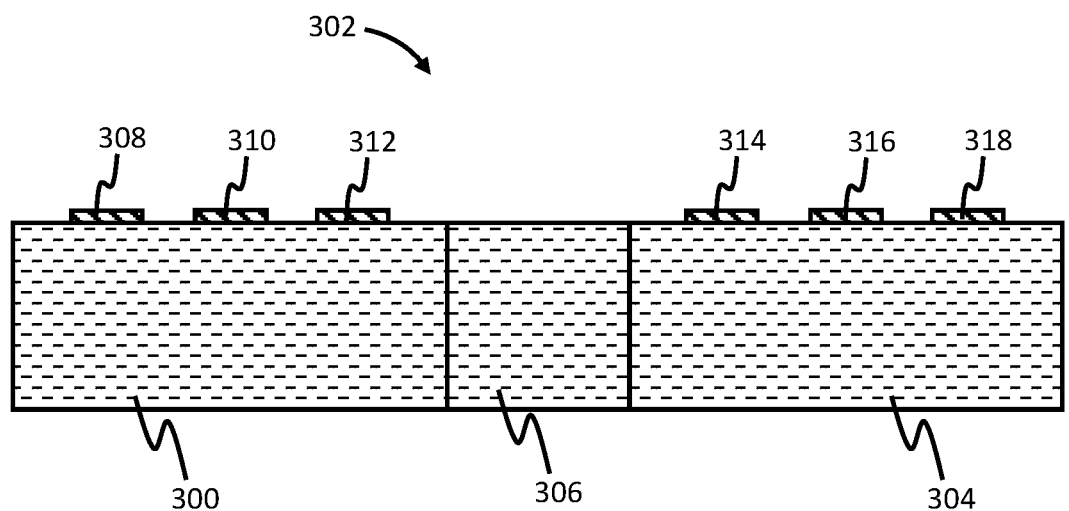
FIG. 3A depicts a first stage of forming an aggregate die substrate with alignment guides, according to embodiments of the present invention.

In FIG. 3A, aggregate die substrate 300 is illustrated as part of a complete wafer 302. Wafer 302 is illustrated as containing aggregate die substrate 300, aggregate die substrate 304, and sacrificial material 306. Each of aggregate die substrates 300 and 304 may be planned for inclusion, for example, in separate aggregate die packages. For example, each of aggregate die substrates 300 and 304 may eventually have matching core sub dies and a cache sub die, resulting in two aggregate die packages, each with a set of core sub dies and a cache sub die attached thereon. Sacrificial material 306, on the other hand, may be the portion of wafer 302 that is cut off to separate aggregate die substrates 300 and 304. Of note, while only two aggregate die substrates 300 and 304 are illustrated, typical embodiments may feature hundreds or thousands of aggregate die substrates for each wafer.

Aggregate die substrate 300 is illustrated with hardmasks 308, 310, and 312 patterned thereon, and aggregate die substrate 304 is illustrated with hardmasks 314, 316, and 318. These hardmasks may be used to pattern alignment guides on aggregate die substrates 300 and 304 during an etching process. As discussed above, sizes, shapes, positions, and compositions of hardmasks 308-318 may, in practice, depend upon the size and shape of alignment guides desired, as well as the etching process and etchant used.

For example, hardmasks with small spaces between them may result in concave alignment guides (e.g., alignment guides 220 and 222), whereas hardmasks with larger spaces between them may result in convex alignment guides (e.g., alignment guides 226 and 228). Further, KOH etching may result in pointed alignment guides, whereas other RIE processes may result in rounded or square-shaped alignment guides.

Figure 3B:
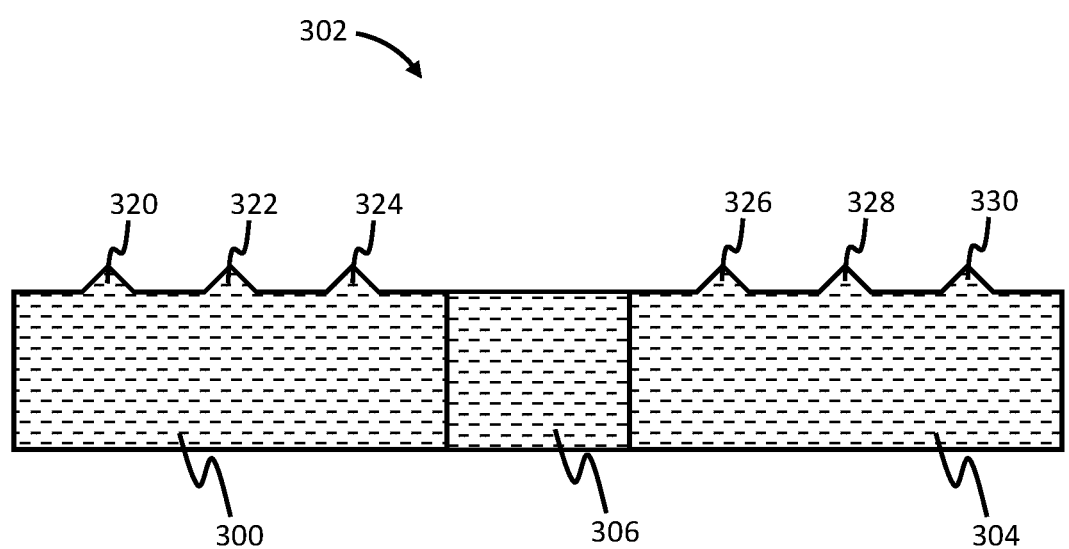
FIG. 3B depicts a second stage of forming the aggregate die substrate with alignment guides, according to embodiments of the present invention.

FIG. 3B illustrates wafer 302 after an etching process has formed substrate alignment guides 320, 322, and 324 onto aggregate die substrate 300 and substrate alignment guides 326, 328, and 330 onto aggregate die substrate 304. The etching process used, for example, may have been a crystallographic preferential etch. After the etching process, hard masks 308-318 are no longer necessary, and thus they have been removed from wafer 302 in FIG. 3B. However, sacrificial material 306 is still present, as wafer 302 has not yet been cut into individual substrates.

Figure 3C:
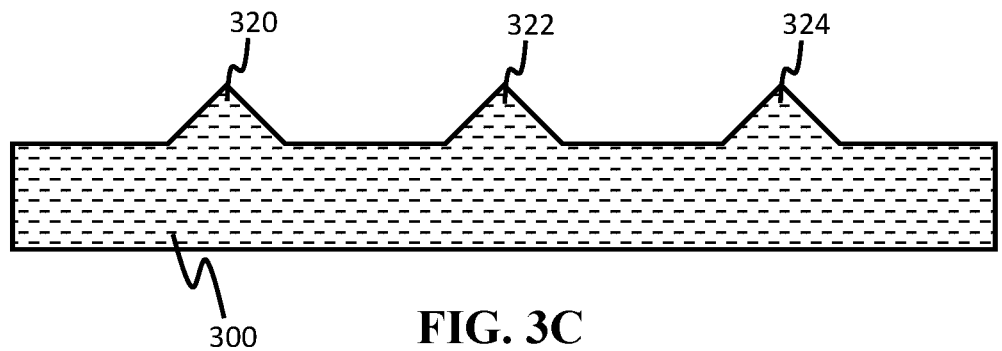
FIG. 3C depicts a third stage of forming the aggregate die substrate with alignment guides, according to embodiments of the present invention.
Figure 3D:
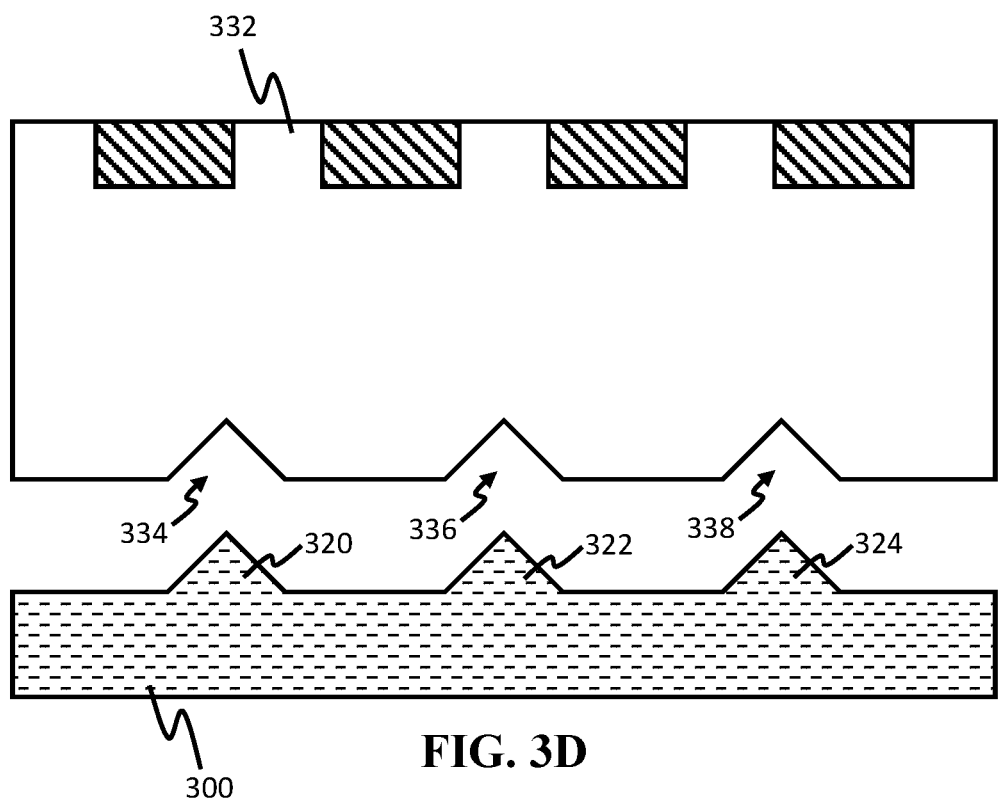
FIG. 3D depicts a first stage of attaching a processor sub die to the aggregate die substrate with alignment guides, according to embodiments of the present invention.

FIG. 3C illustrates aggregate die substrate 300 after it has been thinned to a desired thickness and cut from wafer 302. At this stage, aggregate die substrate 300 may be ready for sub dies to be attached thereon. Thus, FIG. 3D illustrates aggregate die substrate 300 with sub die 332 before sub die 332 is attached to aggregate die substrate 300. As illustrated, sub die 332 features sub-die alignment guides 334, 336, and 338, which are designed to interface with substrate alignment guides 320, 322, and 324.

The entity that fabricated aggregate die substrate 300 may have received sub die 332, for example, from a third-party entity in the form of a wafer of sub dies or in the form of a sub die that has already been separated from the wafer. In some instances, sub die alignment guides 334, 336, and 338 may have been formed upon sub die 332 at the time it was received. In other instances, sub die alignment guides 320, 322, and 324 may be formed upon sub die 332 by the same entity that formed substrate alignment guides 334, 336, and 338.

Figure 3E:
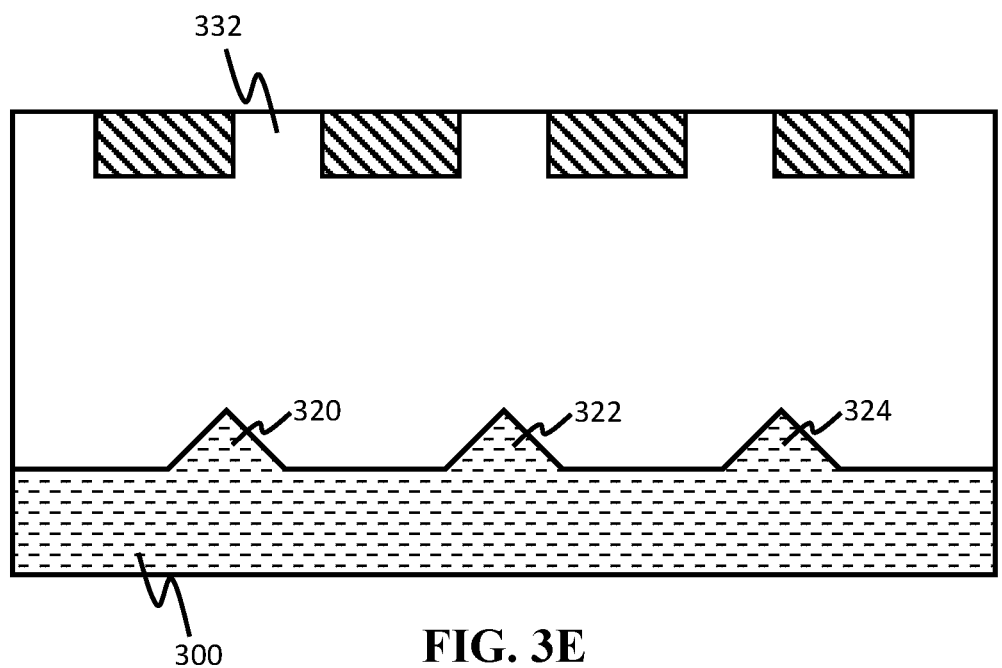
FIG. 3E depicts a second stage of attaching the processor sub die to the aggregate die substrate with alignment guides, according to embodiments of the present invention.

FIG. 3E illustrates aggregate die substrate 300 after sub die 332 has been placed hereon. As illustrated, substrate alignment guides 320, 322, and 324 interface with sub-die alignment guides 334, 336, and 338 (not visible in FIG. 3D) such that precise placement of sub die 332 is encouraged. Of note, while sub die 332 is the only sub die depicted placed on aggregate die substrate 300, this is solely for the purpose of clarity. In typical embodiments multiple sub dies are likely to be added to aggregate die substrate 300.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An aggregate die comprising:
    a wafer substrate with a first surface, wherein the first surface comprises a first set of substrate alignment guides and a second set of substrate alignment guides, and a shape of the first set of substrate alignment guides is different than a shape of the second set of substrate alignment guides; and
    a first sub die attached to the first surface, wherein the first sub die comprises a second surface on which a first set of sub die alignment guides has been etched, wherein the first set of sub die alignment guides interface with the first set of substrate alignment guides,
    wherein the first set of sub die alignment guides are adapted to seat the first sub die into the wafer substrate.

2. The aggregate die of claim 1, wherein a pitch of the first set of substrate alignment guides is different than a pitch of the second set of substrate alignment guides.

3. The aggregate die of claim 1, wherein the first set of substrate alignment guides forms a first pattern, and the second set of substrate alignment guides forms a second pattern that is different from the first pattern.

4. The aggregate die of claim 1, wherein a first substrate alignment guide in the first set of substrate alignment guides has a rounded shape.

5. The aggregate die of claim 4, wherein a second substrate alignment guide in the first set of substrate alignment guides has a pointed shape.

6. The aggregate die of claim 1, wherein a size of the first set of substrate alignment guides is different than a size of the second set of substrate alignment guides.

7. The aggregate die of claim 1, wherein a size of a first sub die alignment guide in the first set of sub die alignment guides is different than a size of a second sub die alignment guide in the first set of sub die alignment guides.

8. The aggregate die of claim 1, wherein a first substrate alignment guide in the first set of substrate alignment guides is convex and a second substrate alignment guide in the first set of substrate alignment guides is concave.

9. The aggregate die of claim 1, further comprising a second sub die attached to the first surface, wherein a material composition of the first sub die is different than a material composition of the second sub die.

10. The aggregate die of claim 1, further comprising:
    a second sub die attached to the first surface; and
    a wire within the aggregate die that connects a contact on the first sub die to a contact on the second sub die.

11. A sub die comprising:
    a first surface on which a set of pointed sub die alignment guides has been etched, wherein the pointed sub die alignment guides take a form of pointed bumps on the first surface, wherein the pointed sub die alignment guides are adapted to seat the sub die into a wafer substrate; and
    a second surface with a set of sub die contacts, wherein the second surface is opposite the first surface.

12. An aggregate die comprising:
    a wafer substrate with a first surface, wherein the first surface comprises a first set of substrate alignment guides and a second set of substrate alignment guides, and a size of the first set of substrate alignment guides is different than a size of the second set of substrate alignment guides; and
    a first sub die attached to the first surface, wherein the first sub die comprises a second surface on which a first set of sub die alignment guides has been etched, wherein the first set of sub die alignment guides interface with the first set of substrate alignment guides,
    wherein the first set of sub die alignment guides are adapted to seat the first sub die into the wafer substrate.

* * * * *